United States Patent
Moder et al.

(10) Patent No.: US 10,497,583 B2
(45) Date of Patent: Dec. 3, 2019

(54) METHOD FOR MANUFACTURING A SEMICONDUCTOR DEVICE COMPRISING ETCHING A SEMICONDUCTOR MATERIAL

(71) Applicant: Infineon Technologies AG, Neubiberg (DE)

(72) Inventors: Iris Moder, Villach (AT); Sophia Friedler, Vienna (AT); Ingo Muri, Villach (AT); Hans-Joachim Schulze, Taufkirchen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/927,551

(22) Filed: Mar. 21, 2018

(65) Prior Publication Data

US 2018/0277391 A1  Sep. 27, 2018

(30) Foreign Application Priority Data

Mar. 22, 2017  (DE) .......................... 10 2017 106 202

(51) Int. Cl.
| | |
|---|---|
| *H01L 31/113* | (2006.01) |
| *H01L 21/3213* | (2006.01) |
| *H01L 21/265* | (2006.01) |
| *H01L 21/304* | (2006.01) |
| *H01L 21/306* | (2006.01) |
| *H01L 21/308* | (2006.01) |

(Continued)

(52) U.S. Cl.
CPC ...... *H01L 21/32139* (2013.01); *H01L 21/265* (2013.01); *H01L 21/304* (2013.01); *H01L 21/3083* (2013.01); *H01L 21/30608* (2013.01); *H01L 21/324* (2013.01); *H01L 21/784* (2013.01); *H01L 29/0661* (2013.01); *H01L 29/1095* (2013.01); *H01L 29/6634* (2013.01); *H01L 29/66348* (2013.01); *H01L 29/7397* (2013.01); *H01L 21/26506* (2013.01); *H01L 29/0638* (2013.01)

(58) Field of Classification Search
CPC .......... H01L 21/32139; H01L 21/3083; H01L 21/30608; H01L 21/0334; H01L 21/0335; H01L 21/0337; H01L 21/32; H01L 29/0661; H01L 21/3086; H01L 21/31144; H01L 21/467; H01L 21/475; H01L 21/02019; H01L 21/30617; H01L 21/302
See application file for complete search history.

(56) References Cited

U.S. PATENT DOCUMENTS

| | | | |
|---|---|---|---|
| 9,087,777 B2 * | 7/2015 | Yang .................. | H01L 21/6835 |
| 2014/0002822 A1 * | 1/2014 | Chen .................. | G03F 7/70633 |
| | | | 356/400 |

(Continued)

FOREIGN PATENT DOCUMENTS

DE    102016120080 A1    5/2017

*Primary Examiner* — Hsien Ming Lee
(74) *Attorney, Agent, or Firm* — Slater Matsil, LLP

(57) ABSTRACT

According to embodiments, a method for manufacturing a semiconductor device includes forming a mask comprising a pattern of inert structures on a side of a first main surface of a semiconductor substrate. A semiconductor layer is formed over the first main surface, and the semiconductor substrate is thinned from a second main surface opposite to the first main surface. Thereafter, a semiconductor region laterally adjoining the inert structures is anisotropically etched.

18 Claims, 15 Drawing Sheets

(51) Int. Cl.
  *H01L 21/324*  (2006.01)
  *H01L 21/784*  (2006.01)
  *H01L 29/10*   (2006.01)
  *H01L 29/66*   (2006.01)
  *H01L 29/739*  (2006.01)
  *H01L 29/06*   (2006.01)

(56) References Cited

U.S. PATENT DOCUMENTS

2014/0113390 A1   4/2014  Ploessl et al.
2015/0179737 A1   6/2015  Schulze et al.
2017/0133465 A1   5/2017  Mauder et al.
2018/0226471 A1*  8/2018  Hille ................... H01L 29/8611

* cited by examiner

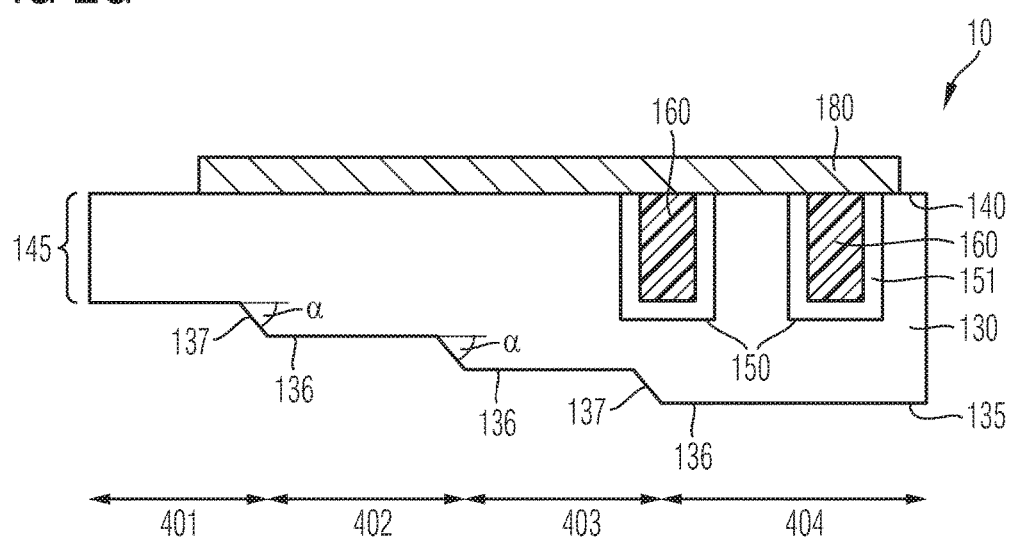

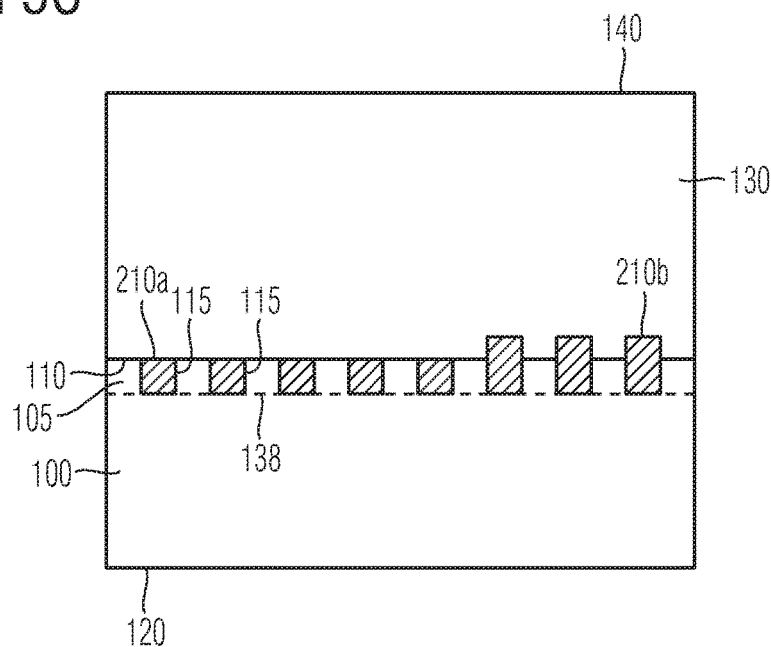
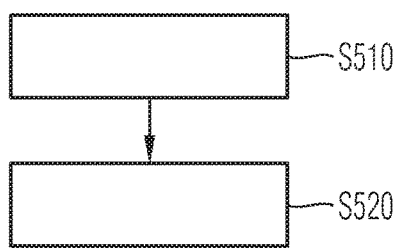 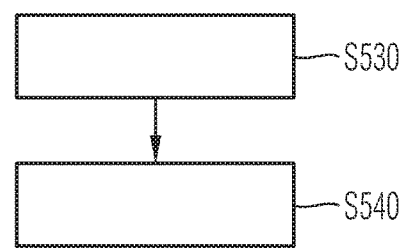

ically etching the semiconductor material.
METHOD FOR MANUFACTURING A SEMICONDUCTOR DEVICE COMPRISING ETCHING A SEMICONDUCTOR MATERIAL This application claims the benefit of German Application No. 102017106202.5, filed on Mar. 22, 2017, which application is hereby incorporated herein by reference in its entirety.

BACKGROUND

Power transistors commonly employed in automotive and industrial electronics require a low on-state resistance ($R_{on} \cdot A$), while securing a high voltage blocking capability. For example, a MOS ("metal oxide semiconductor") power transistor should be capable, depending upon application requirements, to block drain to source voltages $V_{ds}$ of some tens to some hundreds or thousands volts. MOS power transistors typically conduct very large currents which may be up to some hundreds of Amperes at typical gate-source voltage of about 2 to 20V.

Attempts are being made to reduce the on-state resistance. For example, according to concepts, power transistors may be formed in very thin substrates. It is desirable to develop new methods for manufacturing semiconductor devices which may be applied to substrates having very small thicknesses.

SUMMARY

According to one or more embodiments, a method for manufacturing a semiconductor device comprises forming a mask comprising a pattern of inert structures on a side of a first main surface of a semiconductor substrate, and forming a semiconductor layer over the first main surface. The method further comprises thinning the semiconductor substrate from a second main surface opposite to the first main surface, and thereafter, anisotropically etching a semiconductor region laterally adjoining the inert structures.

According to one or more embodiments, a method for manufacturing a semiconductor device comprises forming a mask in a semiconductor material. The mask comprises a first mask portion in a first portion of the semiconductor material and a second mask portion in a second portion of the semiconductor material. The first mask portion is configured to induce an etching at a first etch rate, and the second mask portion is configured to induce an etching at a second etch rate, the first etch rate being different from the second etch rate. The method further comprises anisotropically etching the semiconductor material.

According to still further embodiments, a power semiconductor device is formed in a semiconductor body. A rear surface of the semiconductor body is patterned to comprise a step, the step having an inclined sidewall, the inclined sidewall having an angle of more than 1° and less than 60° with respect to a horizontal surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 2G illustrates a vertical cross-sectional view of a power semiconductor device according to one or more embodiments;

FIGS. 5A to 5C illustrate views of a workpiece when performing a method according to one or more embodiments;

FIG. 5D summarizes a method according to one or more embodiments;

FIG. 5E summarizes a method according to one or more embodiments;

DETAILED DESCRIPTION OF ILLUSTRATIVE EMBODIMENTS

Figure 1:
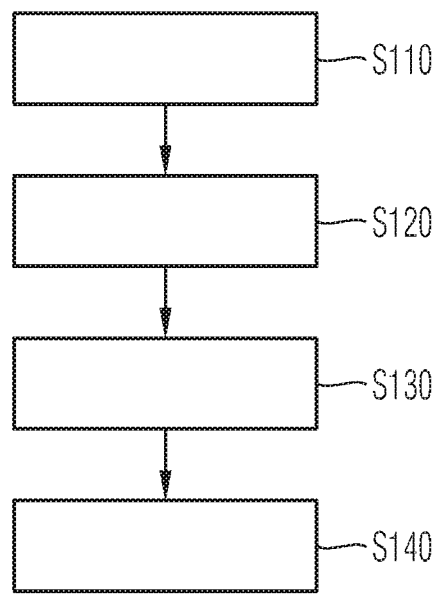
FIG. 1 schematically illustrates a method according to one or more embodiments.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The term "vertical" as used in this specification intends to describe an orientation which is arranged perpendicular to the first surface of the semiconductor substrate or semiconductor body.

The terms "lateral" and "horizontal" as used in this specification intends to describe an orientation parallel to a first surface of a semiconductor substrate or semiconductor body. This can be for instance the surface of a wafer or a die.

As used, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The Figures and the description illustrate relative doping concentrations by indicating "–" or "+" next to the doping type "n" or "p". For example, "n–" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

FIG. 1 illustrates a method for manufacturing a semiconductor device according to one or more embodiments. As is shown, a method for manufacturing a semiconductor device comprises forming a mask comprising a pattern of inert structures on a side of a first main surface of a semiconductor substrate (S110), forming a semiconductor layer over the first main surface (S120), thinning the semiconductor substrate from a second main surface (S130) opposite to the first main surface, and thereafter, anisotropically etching a semiconductor material (S140) laterally adjoining the inert structures. The mask comprises a pattern, i.e. an arrangement of repeated or identical inert structures. The mask vertically extends in a portion to be etched of the semiconductor material. For example, forming the semiconductor layer may comprise epitaxially growing the semiconductor layer.

For example, forming the mask may comprise forming and patterning a layer of an inert material over the first main surface of the semiconductor substrate. In this case, the semiconductor region that is anisotropically etched may be the material of the formed semiconductor layer.

According to further embodiments, forming the mask may comprise forming trenches in the first main surface of the semiconductor substrate, and filling the trenches with an inert material. In this case, the semiconductor region that is anisotropically etched may comprise the material of the semiconductor substrate.

Within the context of the present specification, the term "laterally adjoining" or "laterally surrounding" is intended to mean a region that adjoins the inert structures in a horizontal plane. In more detail, the region laterally adjoining the inert structures may overlap with the inert structure in a vertical direction.

FIGS. 2A to 2F illustrate a workpiece when performing these processing steps.

According to concepts, a semiconductor device may be formed in a monocrystalline silicon layer which is formed over a silicon substrate. According to embodiments, a starting point for performing the method is a semiconductor substrate 100 e.g. a silicon substrate, having a second main surface 120 and a first main surface no. According to embodiments, a mask is formed at the first main surface no. The mask extends into an e.g. monocrystalline semiconductor material. For example, this may be accomplished by forming the mask on a semiconductor substrate and, thereafter, forming a layer of e.g. monocrystalline semiconductor material so that the mask is embedded or buried in the formed monocrystalline semiconductor material. Forming the mask may comprise forming a pattern of inert structures. Forming the inert structures may comprise forming a layer of the inert material, followed by a patterning process. According to further embodiments, the inert material may be formed in a patterned manner, e.g. by a suitable printing process. According to still further embodiments, trenches may be formed in the semiconductor substrate 100, followed by filling the trenches with the inert material and a process of recessing the inert material, e.g. by etching back or a suitable polishing process. As a result of forming the mask, the region of the semiconductor material to be etched is laterally adjoining the inert structures.

The inert structures may be made of a material that will not be etched by an anisotropic wet etching process for etching the semiconductor material that is to be performed. For example, the semiconductor material may be silicon. The inert material may be silicon oxide, silicon nitride, carbon or a combination of these materials.

Figure 2A:
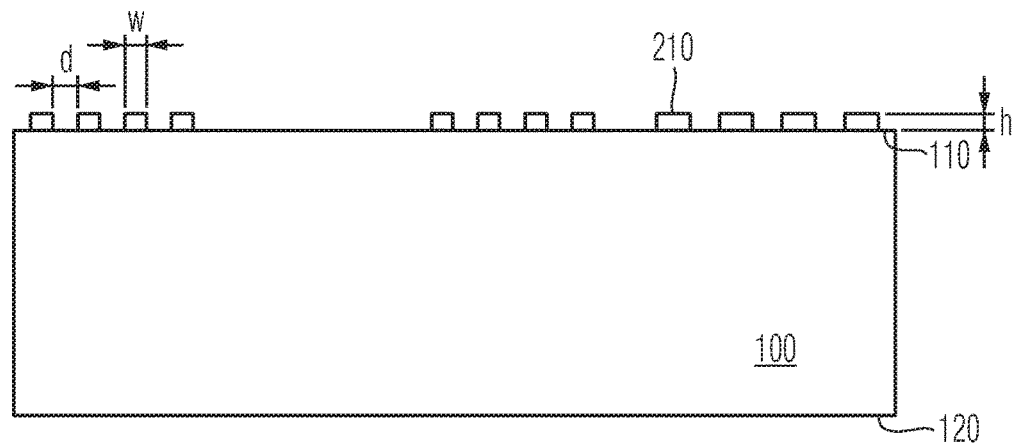
FIGS. 2A to 2F illustrate views of a workpiece when performing a method according to one or more embodiments.
Figure 2B:
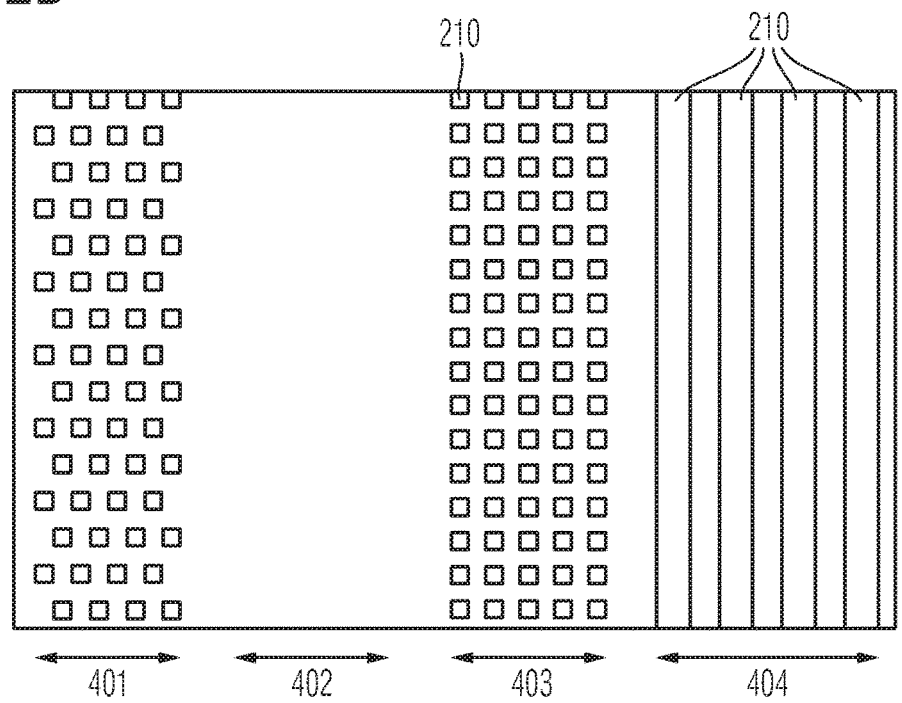

FIG. 2A shows a vertical cross-sectional view of a semiconductor substrate 100, e.g. a silicon substrate, comprising inert structures 210 over the first main surface no of the semiconductor substrate. FIG. 2B shows a schematic plan view of the substrate. FIG. 2B shows four regions 401, 402, 403 and 404 in which the inert material is patterned according to different patterns. For example, the pattern of inert structures may comprise dots of the inert material (Regions 401, 403) or stripes of the inert material (region 404). The diameter of the dots need not be a square shape, it also may be an elongated shape (e.g. a rectangular shape). For example, the structures 210 may have a width w of 50 to 700 nm, e.g. 200 to 700 nm. Further, a distance d between adjacent structures may be 200 to 700 nm. The height h of the structures may be selected in dependence from the pattern to be formed in the monocrystalline semiconductor material as will be explained later. According to examples, the height h of the structures may be 200 nm to 10 μm.

As is shown in FIG. 2B, in region 401 the single structures 210 may be arranged in a checkerboard-like pattern, i.e. rows of dots the positions of which being shifted from row to row. Region 402 shows a portion without any inert structures. Region 403 shows a regular pattern of inert structures 210 which may be arranged in rows and columns, the rows and columns corresponding to an extension direction of the sidewalls of the single inert structures 210. In region 404, the inert structures 210 form a stripe pattern. According to the example shown in FIGS. 2A and 2B, the semiconductor substrate may be a (100) silicon wafer and the silicon oxide structures are oriented in a (110) direction.

Thereafter, an epitaxial lateral overgrowth ("ELO") process may be performed in order to epitaxially grow the layer of monocrystalline semiconductor material 130 over the semiconductor substrate 100. The resulting workpiece 145 comprises the semiconductor substrate 100 and the monocrystalline semiconductor material 130. For example, the monocrystalline semiconductor material 130 may be the same as the material of the semiconductor substrate 100, for example, silicon. The layer of monocrystalline semiconductor material 130 has a first main surface 140. For example, a thickness of layer of monocrystalline semiconductor material 130 may be less than 100 μm, e.g. 1 to 100 μm, and further less than 50 μm or less than 20 μm. For example, a thickness of layer of monocrystalline semiconductor material 130 may be more than 5 μm.

Components of semiconductor devices, e.g. power devices, for example, power transistors may be formed in the first main surface 140 of the layer of monocrystalline semiconductor material 130. For example, trenches 150 may be etched and may be filled with, e.g. an insulating material 151 and a conductive filling 160. For example, gate electrodes may be arranged in these trenches 150. A metallization layer 180 may be formed over the first main surface 140 of the layer of monocrystalline semiconductor material. Processing the monocrystalline semiconductor material 130 may e.g. comprise etching processes, deposition processes and further doping processes. Thereafter, the workpiece 145 is mounted to a suitable carrier (not shown in this drawing) to process a rear surface of the semiconductor substrate 100.

Figure 2C:
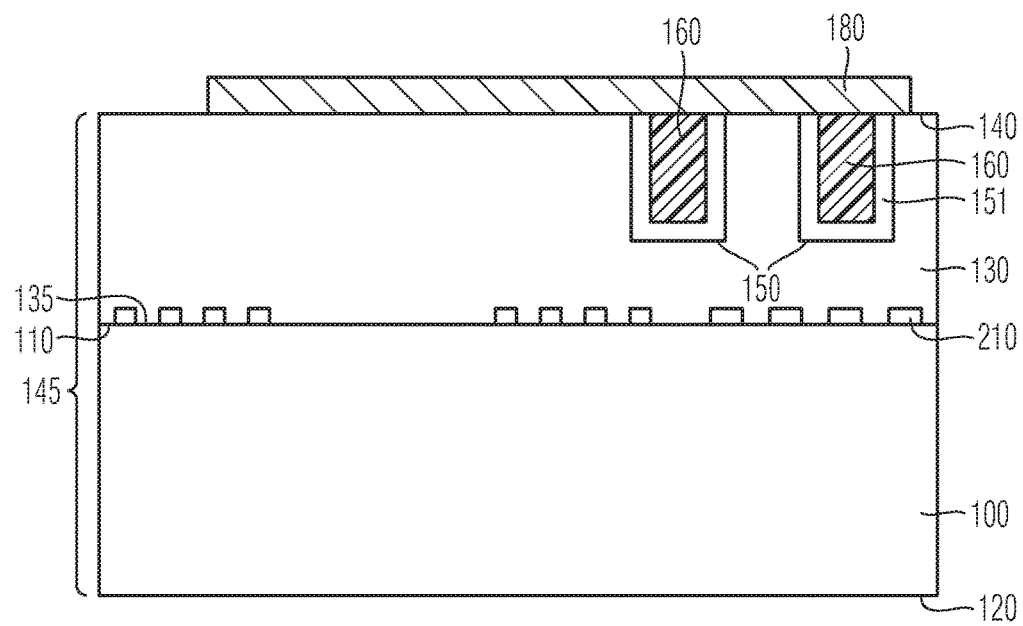

FIG. 2C shows an example of a resulting workpiece 145. The workpiece 145 comprises the semiconductor substrate 100 and the monocrystalline semiconductor material 130. The inert structures 210 are arranged to be buried in the monocrystalline semiconductor material 130. According to one or more embodiments, they are formed directly adjacent to a second main surface 135 of the monocrystalline semiconductor material 130. In more detail, the inert structures 210 are formed so as to protrude from the semiconductor substrate 100 and extend into the monocrystalline semiconductor material 130. According to further embodiments, the inert structures 210 may be formed in trenches formed in the first main surface no of the semiconductor substrate 100. In this case, the monocrystalline semiconductor material 130 and the portion of the semiconductor substrate 100 into which the trenches vertically extend constitute the monocrystalline semiconductor material to be etched.

Thereafter, a thinning process for recessing the rear surface of the semiconductor substrate 100 is performed. For example, the semiconductor wafer 100 may be thinned by performing a grinding process, a chemical mechanical polishing (CMP) process or an etching process or a combination of these processes. For example, a resulting thickness of the workpiece 145 may be less than 100 μm, e.g. 1 to 100 μm, and further less than 50 μm or less than 20 μm. For example, a thickness of the workpiece 145 may be more than 5 μm. For example, the thinning process is performed so that approximately less than 10 μm, e.g. 1 to 10 μm of the semiconductor substrate 100 remain below the inert structures 210, e.g. between the inert structures 210 and the resulting rear surface 120.

Figure 2D:
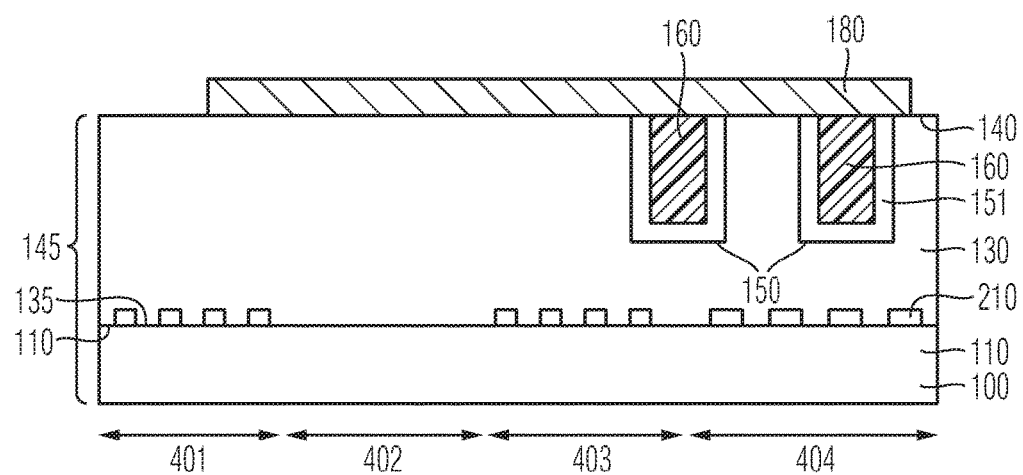

FIG. 2D shows an example of a resulting structure. As is shown, the workpiece 145 has been thinned. FIG. 2D shows the different regions 401, 402, 403, and 404 in which the inert structures 210 are patterned according to different patterns. Accordingly, the pattern of inert structures is different in any of the regions 401, 402, 403, and 404, respectively.

Thereafter, an etching process is performed, e.g. using an anisotropic wet etchant. The etchant may be KOH (potassium hydroxide) optionally including an additive such as isopropanol. For example, the concentration of KOH may be 10 to 60 wt.-%. According to further embodiments tetramethylammonium hydroxide (TMAH) optionally including an additive such as isopropanol may be used. A concentration of TMAH may be 3 to 40 wt. %, e.g. less than 30 wt. %.

During this etching process, due to the presence of the inert structures 210, different crystal planes are formed. In other words, etching in different crystal directions is induced. As a consequence, while etching material between the inert structures 210, different etch rates are achieved due to the different patterns of the inert structures.

Figure 2E:
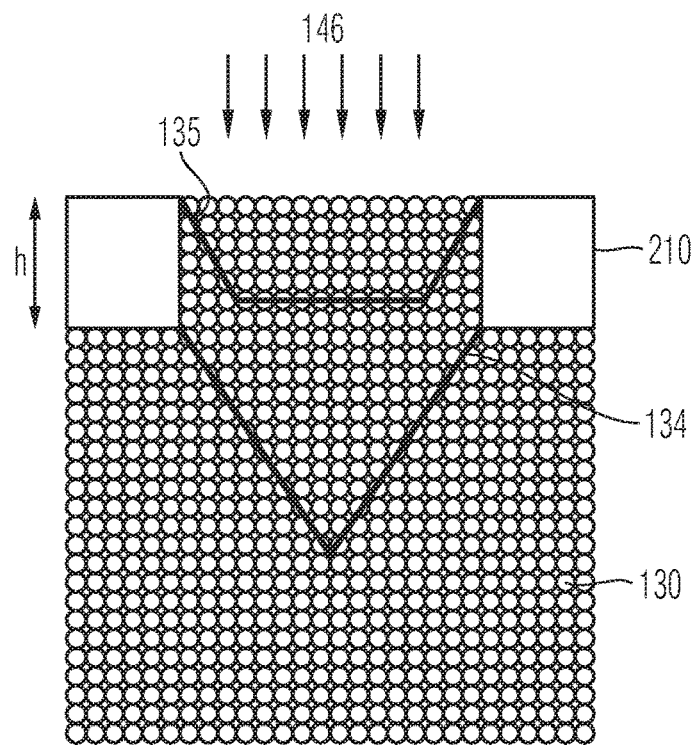
Figure 2F:
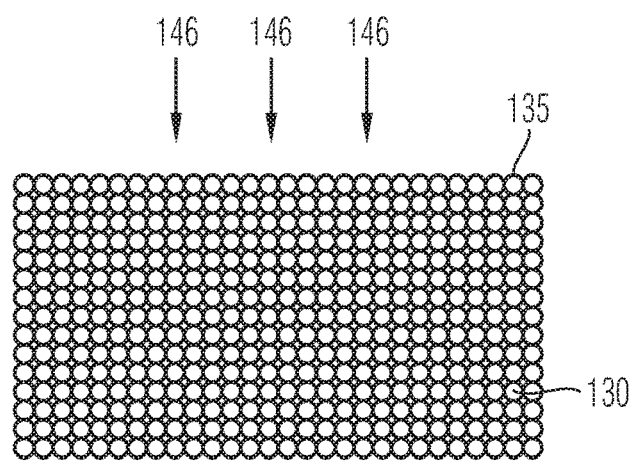

FIG. 2E shows a schematic cross-sectional view of a region of the monocrystalline semiconductor material 130 when performing an etching process. As is shown, inert structures 210 are embedded in the region to be etched of the monocrystalline semiconductor material 130. The arrows 146 denote an etchant attacking a surface of the monocrystalline semiconductor material 130. According to embodiments illustrated in FIG. 2E, the surface 135 of the semiconductor material 130 corresponds to the (100) surface. The inert structures 210 vertically extend in the monocrystalline semiconductor material 130 that is to be etched. As a consequence, the specific pattern of the inert structures 210 suppresses etching in certain directions and thus influences the crystal direction in which the etching takes place. In more detail, when the inert structures 210 form a stripe-shaped pattern, etching in the (100) direction may be suppressed so that only etching in the (111) direction takes place. Reference numeral 134 denotes the (111) crystal plane in this example. For the sake of comparison, in case of no pattern being present in region 402 as illustrated in FIG. 2F, etching in the (100) direction is performed.

For example, in region 401 comprising the checkerboard pattern of inert structures, planes are formed which may be etched at a higher etch rate than the (100) direction. In region 403 comprising a regular pattern of the inert structures, for example, etching perpendicular to a plane having a higher index such as the (331) or (431) plane may be accomplished. As a consequence, a slower etch rate than in regions 401 and 402 may be achieved. In region 404, according to an example, etching in the (111) direction may be performed which is the slowest etch rate due to the small number of open bonds at the surface. As is clearly to be understood, according to embodiments, etching may be performed in further crystalline directions that are different from the directions indicated above. The description is not limiting with respect to any of the indicated crystalline directions.

As a result, different etch rates may be achieved in the different regions 401, 402, 403, 404. According to embodiments, after etching the material between the inert structures 210, etching may be continued. In more detail, the monocrystalline semiconductor material 130 may be etched to a deeper depth than the height h of the inert structures. After underetching of the inert structures, the specific roughness of the second main surface 135 disappears and a smooth surface may be obtained. As a result of the etching process, a step-like pattern of the second main surface 135 of the monocrystalline semiconductor material 130 may be maintained while achieving a desired thickness of the monocrystalline semiconductor material 130. Accordingly, the etching may be understood to comprise a first etching process of etching the semiconductor material laterally adjoining the inert structures 210 and a second etching process to etch the semiconductor material beyond the inert structures. During the second etching process, etching in the (100) direction is performed, with an angle α between the steps being 50° to 60°, e.g. 52° to 58°, more specifically 54° to 56°, e.g. corresponding to α=54.7° which corresponds to the angle of the (111) plane with respect to the (100) plane. An etch rate of the second etching process is different from the etch rate of the first etching process.

FIG. 2G shows an example of a resulting structure. As is shown, the second main surface 135 of the workpiece 145 comprises different regions in which the monocrystalline semiconductor material 130 has different thicknesses. In particular, in region 401, the thickness of the semiconductor material has the smallest value, while in region 404 the thickness of the semiconductor material 130 has the largest value.

As is shown in FIG. 2G, a power semiconductor device 10 is formed in a monocrystalline semiconductor body 130. A rear surface 135 of the monocrystalline semiconductor body 130 is patterned to comprise a step 136, the step 136 having an inclined sidewall 137. The inclined sidewall 137 has an angle α of more than 0°, e.g. more than 1°, the angle α being measured with respect to a horizontal surface within the semiconductor material. The inclined sidewall 137 may have an angle α of less than 60°, e.g. less than 58°, more specifically less than 56°, e.g. 54.7° or less. For example, the rear surface 135 of the monocrystalline semiconductor body 130 may be patterned to comprises two or more steps. The monocrystalline semiconductor body may have a thickness of less than 100 µm.

According to further embodiments, by appropriately arranging regions having different patterns of inert structures 210 and by setting the widths of the regions, a quasi-continuous oblique surface may be formed. In more detail, the widths of the regions may be set to a comparably small values so that a plurality of small steps are arranged adjacent to each other. By setting the widths of the regions, an angle of the resulting surface may be set, the angle being less than 60°, e.g. less than 58, more specifically, less than 56°, e.g. 54.7°. The angle may be larger than 0°, e.g. more than 1°.

In the described method, by setting the height h of the inert structures 210, the height of the steps between region 401, 402, 403, and 404 may be determined. The height of the inert structures 210 does not need to be uniform over the workpiece 145. As a consequence, a topology of the second main surface may be further influenced. For example, the height of region 401 may be different from the height in region 403 and the height in region 404 respectively.

Figure 3A:
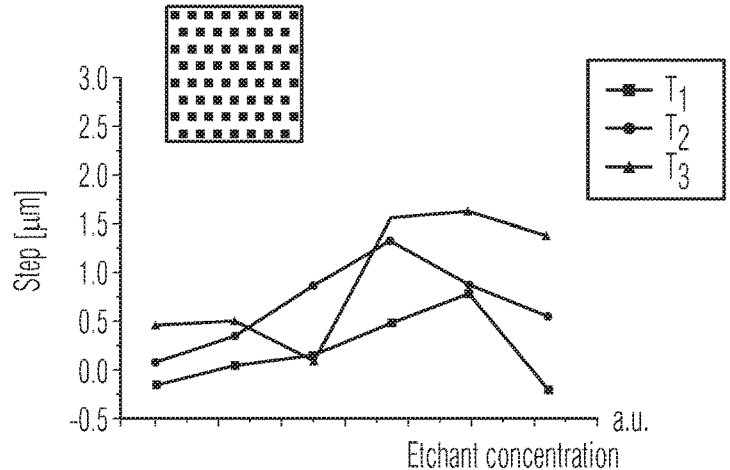
FIGS. 3A to 3C show measurement results of different steps heights formed using methods according to embodiments.
Figure 3B:
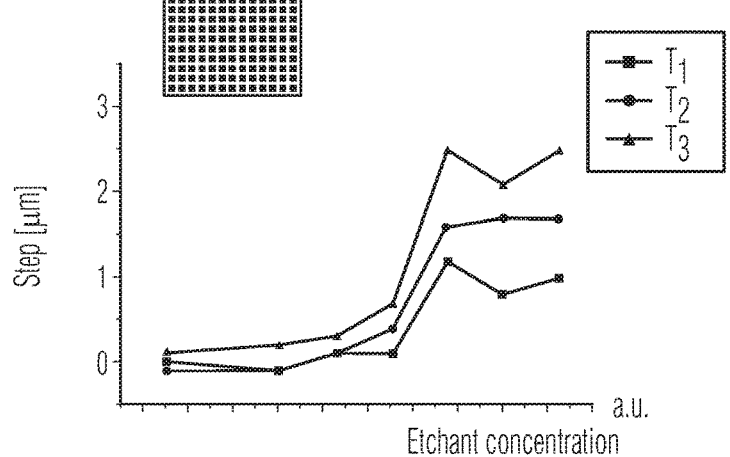
Figure 3C:
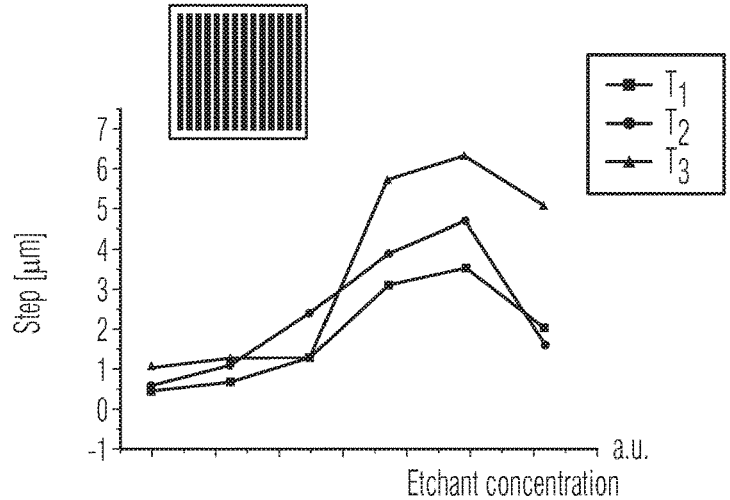

Further, by changing the temperature or the composition of the etchant, the depth of the different regions may be influenced. FIGS. 3A to 3C illustrate the influence of composition of the etchant, temperature and a specific pattern of the inert structures 210 on the height of a step formed between a first portion and a second portion of the monocrystalline semiconductor material 130. The inert structures 210 are made of silicon oxide and have a height of 500 to 600 nm. The inert structures 210 are buried in the first portion of the monocrystalline semiconductor material 130. The inert structures 210 are absent from the second portion of the monocrystalline semiconductor material 130. FIG. 3A shows the height of the step when the inert structures 210 are arranged in a checkerboard pattern in dependence from the etchant concentration and temperature. Temperature T1 is smaller than temperature T2, and temperature T2 is smaller than temperature T3. Depending on the temperature, a step height of 1.5 µm may be achieved.

FIG. 3B shows the height of the step when the inert structures 210 are arranged in a regular pattern of rows and columns along the x and y direction. As is shown, depending on the temperature, a step height of approximately 2.5 µm may be achieved.

FIG. 3C shows the height of the step when the inert structures 210 are arranged in a stripe pattern. As is shown, depending on the temperature, a step height of approximately 6 µm may be achieved.

According to further embodiments, a semiconductor workpiece 145 having a rough second main surface 135 may be generated.

Figure 4A:
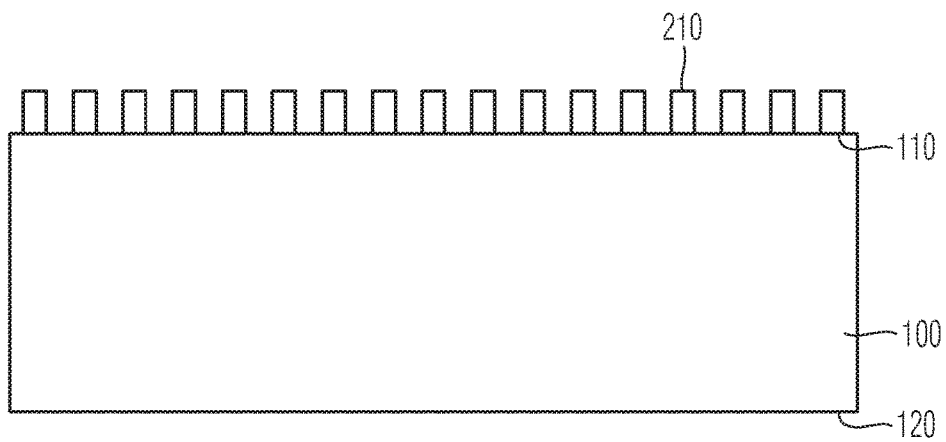
FIGS. 4A to 4D illustrate views of a workpiece when performing a method according to one or more embodiments.

According to embodiments illustrated in FIG. 4A, inert structures 210 are formed. The inert structures 210 may be identical in shape and distance. In particular, they may have the same height. Accordingly, the pattern may be homogenous over the workpiece. After forming the inert structures 210 an epitaxial layer 130 may be formed over the first main surface no of the semiconductor substrate.

Figure 4B:
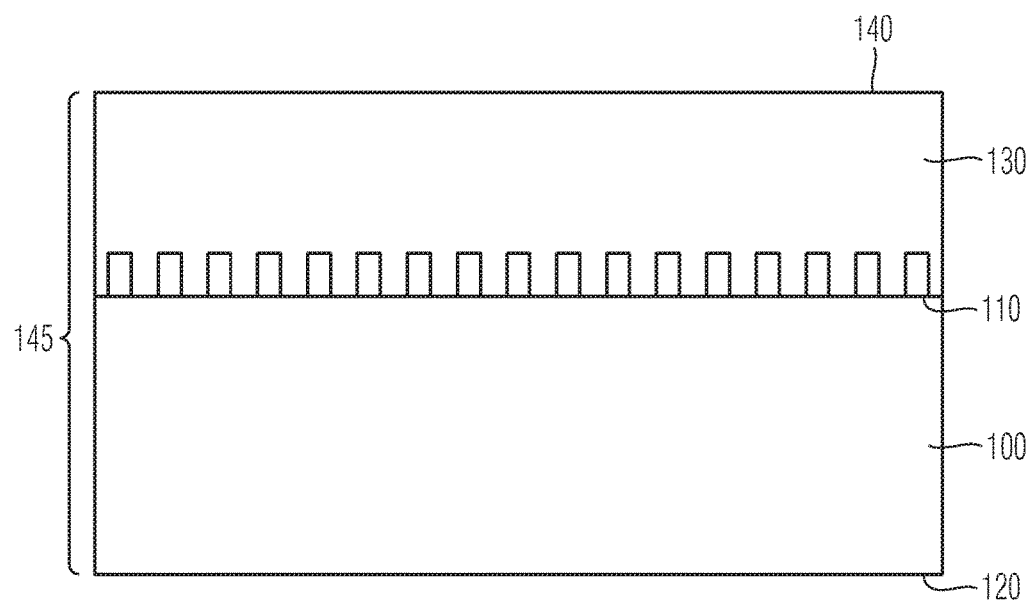

FIG. 4B shows an example of a resulting workpiece 145. As is clearly to be understood, instead of forming protruding portions to form the inert structures 210, the inert structures 210 may be also formed in trenches, e.g. by patterning trenches and filling them with the inert material.

Figure 4C:
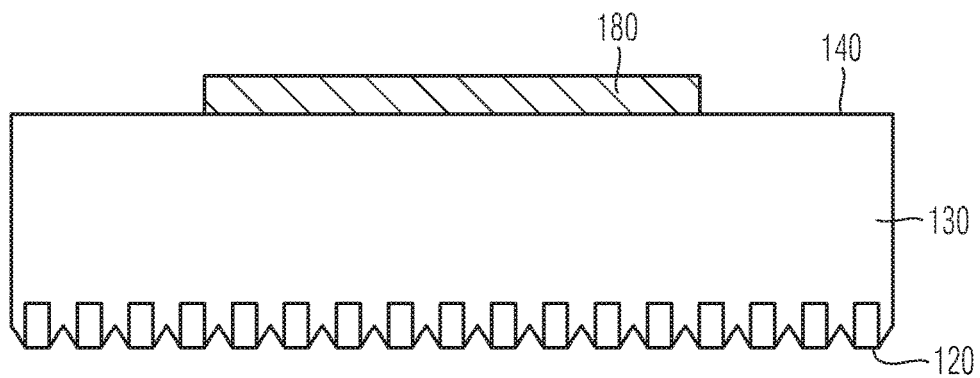

Thereafter, etching using an anisotropic wet etchant is performed. As a result, etching in a specific direction is induced, the direction depending on the pattern of the inert structures 210. In contrast to the method that has been explained with reference of FIGS. 2A to 2F, due to the homogenous pattern of the inert structures 210, a homogenous etch rate may be achieved. Further, the etching process is stopped before an etching depth corresponds to the height h of the inert structures 210. For example, the etching process may be stopped by removing the semiconductor workpiece from the etching chamber. In more detail, the etching process is stopped as soon as the semiconductor material laterally adjoining the inert structures has been etched. FIG. 4C schematically shows a cross-sectional view of a resulting structure.

Figure 4D:
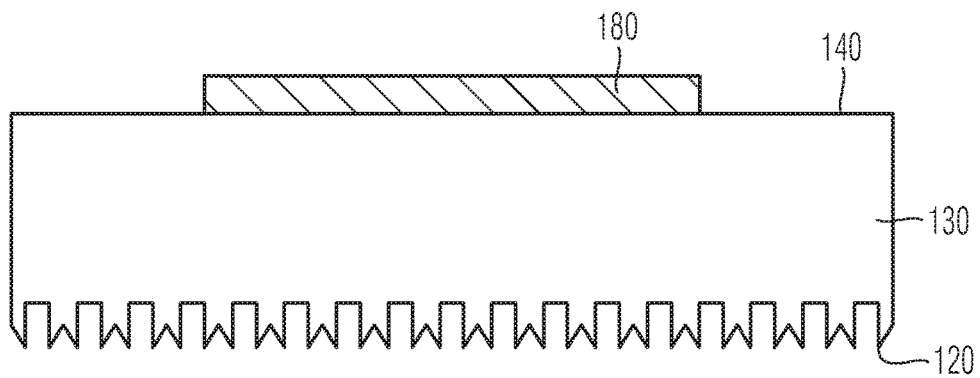

Thereafter, the inert structures are removed. As a consequence, a rough second main surface 135 of the workpiece 145 is obtained. FIG. 4D shows an example of a resulting structure.

Figure 5A:
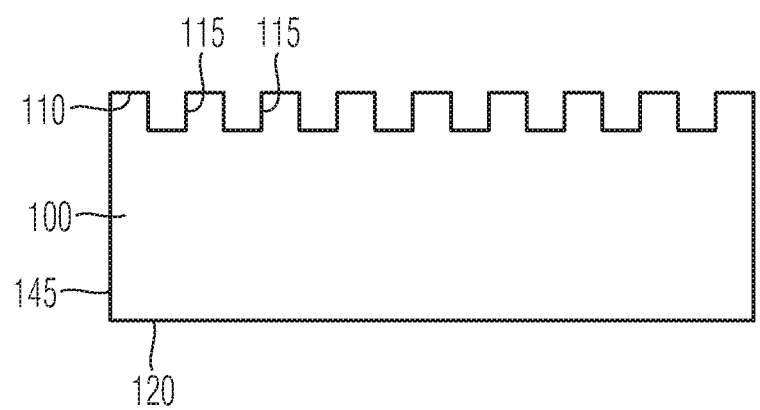
Figure 5B:
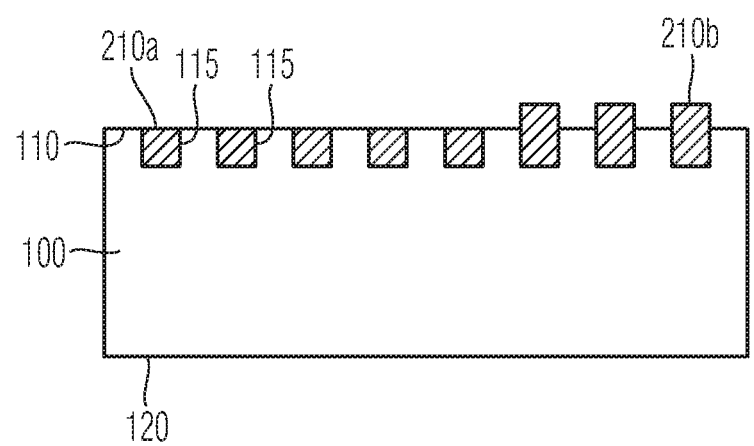

FIGS. 5A to 5C illustrate a modification of the described method of forming the inert structures 210 vertically extending in the monocrystalline semiconductor material to be etched. Trenches 115 are formed in the first main surface no of the semiconductor substrate 100. The trenches 115 may correspond in shape and arrangement to the inert structures 210 that have been discussed with reference to FIGS. 2A and 2B. In other words, the trenches 115 may have a depth corresponding to the height h of the inert structures, a width and a distance corresponding to a width and a distance of the inert structures 210. Further, the trenches 115 may have a longitudinal axis running in a direction which is perpendicular to the depicted plane of the drawing. According to further embodiments, the trenches 115 may have a dot-like shape, e.g. square-shaped, nearly square-like shaped and other suitable shapes. For example, the trenches 115 may be formed by etching.

FIG. 5A shows an example of a resulting workpiece 145. Thereafter, an inert material may be filled in the trenches, followed by recessing the inert material. According to embodiments, the inert material may be recessed.

As a consequence, as is illustrated in FIG. 5B, a surface of the trenches 115 filled with the inert material is flush with the first main surface no of the semiconductor substrate 100, thus forming inert structures 210a. In more detail, the inert structures 210a do not protrude from the first main surface no of the semiconductor substrate 100. According to further embodiments, the inert structures 210b may protrude from the first main surface no of the semiconductor substrate.

Thereafter, a layer of monocrystalline semiconductor material 130 may be formed over the semiconductor substrate 100, for example by epitaxial lateral overgrowth. The layer of monocrystalline semiconductor material 130 has a first main surface 140. FIG. 5C shows an example of a resulting workpiece before thinning the semiconductor substrate 100. After mounting the first main surface 140 of the resulting workpiece to a suitable carrier, the first substrate 100 is thinned by grinding, polishing or etching or any combination of these processes from the second main surface 120.

According to one or more embodiments, thereafter, the region 105 laterally adjoining the inert structures 210a, 210b defines the semiconductor material to be etched. A surface 138 of the monocrystalline semiconductor material is indicated by broken lines. Etching is performed in the manner as has been described with reference to FIGS. 2D to 2G.

As is clearly to be understood, the mask vertically extending in a region to be etched of the semiconductor material may be formed by different methods. For example, the workpiece shown in FIG. 5B defines a semiconductor substrate having a mask vertically extending in the semiconductor substrate. Hence, according to further embodiments, an etching process for anisotropically etching the semiconductor substrate may be performed directly starting from the workpiece shown in FIG. 5B.

FIG. 5D summarizes a method for manufacturing a semiconductor device according to one or more embodiments. A method for manufacturing a semiconductor device comprises forming a mask extending into a region of a semiconductor material (S510) and anisotropically etching the region of the semiconductor material (S520). For example, the pattern of inert structures may vertically extend into the region to be etched of the semiconductor material. Differently stated, the inert structures are buried or embedded in a region to be etched. The region to be etched is laterally adjoining the inert structures. Thereafter, the anisotropic etching process is performed.

FIG. 5E summarizes a method for manufacturing a semiconductor device according to further embodiments. The method comprises forming a mask in a semiconductor material (S530), the mask comprising a first mask portion in a first portion of the semiconductor material and a second mask portion in a second portion of the semiconductor material. The first mask portion is configured to induce an etching at a first etch rate, and the second mask portion is configured to induce an etching at a second etch rate. The first etch rate is different from the second etch rate. The method further comprises anisotropically etching the semiconductor material (S540).

As has been described, by performing the method according to embodiments, a semiconductor material may be simultaneously etched to different depths, e.g. using a single anisotropic etching step. For example, a main surface of a semiconductor substrate may be patterned to generate patterns at different heights of the substrate. For example, steps at different heights may be generated without using multiple lithographic methods for patterning a surface of semiconductor material for each of the steps. The method may be used for correspondingly patterning a first main surface or a second main surface of a semiconductor substrate. For example, it may be used for patterning a rear surface or second main surface of a semiconductor substrate, for example, while active structures of the semiconductor device are arranged in the first main surface of the substrate. Further, the method may be used for patterning a main surface of a thin substrate.

As has been described above, after thinning the semiconductor substrate, the workpiece may have a thickness of approximately 5 to 100 µm. By performing the method described, the rear surface of the semiconductor substrate may be patterned without the need of complex processing steps including lithographic steps which may be difficult to employ at semiconductor substrates having a small thickness. For examples, steps of more than 100 nm and even more than 1000 nm, e.g. in a range of several µm may be generated using a single etching process. According to further embodiments, the method may be further modified so as to achieve a gradually varying thickness of the semiconductor substrate.

Figure 6A:
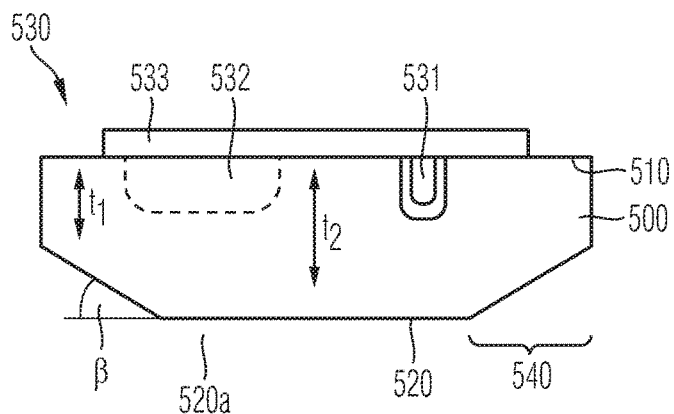
FIG. 6A shows a schematic cross-sectional view of a semiconductor device according to an embodiment.

In the following, further semiconductor devices will be described which may be manufactured using the described method. FIG. 6A shows a semiconductor body 500 having a first main surface 510 and a second main surface 520. For example, components 531, 532, 533 of the semiconductor device such as a gate electrode may be formed adjacent to the first main surface 510. An etching process as has been described above with reference to FIGS. 1 to 5 may be performed to etch the second main surface 520 of the semiconductor body 500. As a result, the semiconductor body 500 may have a first thickness t1 at an edge region and a second thickness t2 in a central region. For example, the first thickness t1 may be in a range of 5 to 100 µm, e.g. 5 to 50 µm, more specifically, 5 to 20 µm. Further, the second thickness t2 in the central region may be in a similar range. A difference between the second thickness t2 and the first thickness t1 may be 500 nm to 7 µm. An angle β between the oblique region of the second main surface 520 and the horizontal region of the second main surface 520 may be less than 60°, e.g. less than 58°, more specifically less than 56°, e.g. 54.7° or less. The angle β may be larger than 0°, e.g. larger than 1°.

According to embodiments, a semiconductor device 530 formed in the semiconductor body 500 may be a power semiconductor device. Specific examples comprise a diode or an IGBT ("insulated gate bipolar transistor"). The region having the decreasing thickness may implement an edge termination region 540 of the semiconductor device. For example, components of the semiconductor device 530 may comprise a gate electrode 531 which may be, for example, be formed in a trench formed in the semiconductor workpiece. Further components may comprise a doped region 532 of a specific conductivity type. Further components may comprise metallization layers 533 or different conductive elements. Due to the specific etching process which has been described, the second main surface 520 may comprise an oblique region. The oblique region may be inclined so as to have an oblique angle β with respect to a planar region 520*a* of the second main surface 520.

Figure 6B:
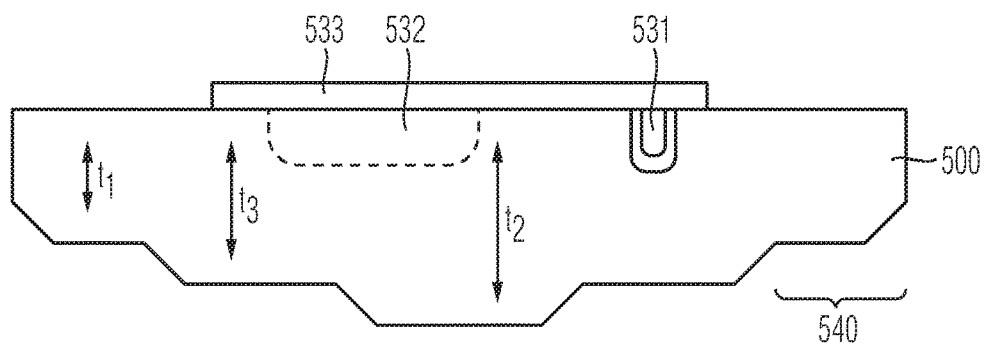
FIG. 6B shows a schematic cross-sectional view of a semiconductor device according to one or more embodiments.

FIG. 6B shows a semiconductor device according to further embodiments, according to which the semiconductor body 500 may have three different thicknesses. In particular, in an edge region, a maximum thickness may be t1. In the central region the thickness may be t2. Further, the semiconductor body 500 may comprise an intermediate region between the central region and the outermost edge region having a thickness t3. The further components of a corresponding semiconductor device 530 may be similar to those illustrated in FIG. 6A. For example, the semiconductor device 530 may implement a power semiconductor device.

Figure 6C:
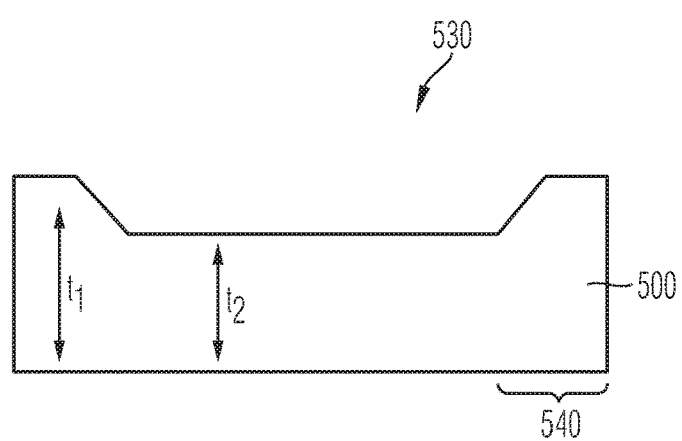
FIG. 6C shows a schematic cross-sectional view of a semiconductor device according to one or more embodiments.

FIG. 6C shows a semiconductor device 530, for example, a power semiconductor device according to further embodiments. As is shown, according to the embodiment illustrated in FIG. 5C, a semiconductor body 500 has a first thickness t1 in an edge region and a second thickness t2 in a central region. The first thickness t1 in the edge region is larger than the second thickness t2 in the central region. For example, the first thickness t1 and the second thickness t2 may be in a range of 5 to 100 μm, for example, 5 to 50 μm, more specifically 5 to 20 μm. In the semiconductor device shown in FIG. 6C, for example, the voltage blocking capability may be improved, resulting in an increased robustness with respect to cosmic radiation in an edge termination region 540 of the semiconductor device. Further, a clamping functionality for an IGBT or a thyristor may be achieved.

Figure 7A:
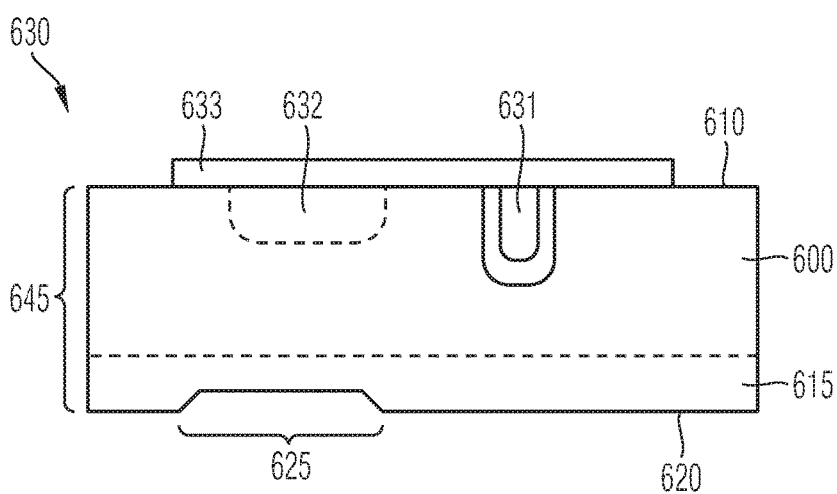
FIG. 7A shows a cross-sectional view of a semiconductor device according to one or more embodiments.

FIG. 7A shows a cross-sectional view of a semiconductor device 630 according to one or more further embodiments. The semiconductor device 630, e.g. a power semiconductor device, shown in FIG. 7A comprises a semiconductor body 600 and a doped region 615 adjacent to a second main surface 620 of the semiconductor body 600. For example, doped region 615 may be doped with a conductivity type opposite to a conductivity type of the semiconductor body 600. For example, the doped region 615 may be formed when epitaxially growing the semiconductor body 600. By way of example, the semiconductor body 600 may be formed on a counter-doped semiconductor substrate 100 and after thinning the semiconductor substrate 100, the doped region 615 remains. According to further options, the doped region 615 may be formed by epitaxial growth. For example, the doped region may be formed using in-situ doping to appropriately adjust the doping type during the epitaxial growth of the semiconductor body 600.

Components of the semiconductor device 630 may be formed adjacent to a first main surface 610 of the semiconductor body 600. For example, these components may comprise a gate electrode 631 which may be arranged in a trench formed in the first main surface 610. The components may further comprise doped regions 632 and metallization layers 633 or other conductive structures. Using the method described, a recessed region 625 may be formed in the second main surface 620 of the semiconductor workpiece 645. In particular, the recessed region 625 may be formed in the doped region 615 so that part of the doped region 615 remains in a vertical direction between the recessed region 625 and the semiconductor body 600. The recessed region 625 may be arranged in an edge region of the semiconductor device 630 or below the gate electrode 631. According to further embodiments, the recessed region 625 may be arranged in a region of gate conductive lines.

For example, the semiconductor device 630 may implement a power semiconductor device, for example, an IGBT, a diode or a thyristor. By forming the recessed region 625, the emitter efficiency may be locally reduced, resulting in a reduced number of free charge carriers. As a consequence, the HDR (high dynamic robustness) of the device may be improved. As is clearly to be understood, the second main surface 620 of the workpiece 645 may be patterned so as to form a plurality of recessed regions 625.

Figure 7B:
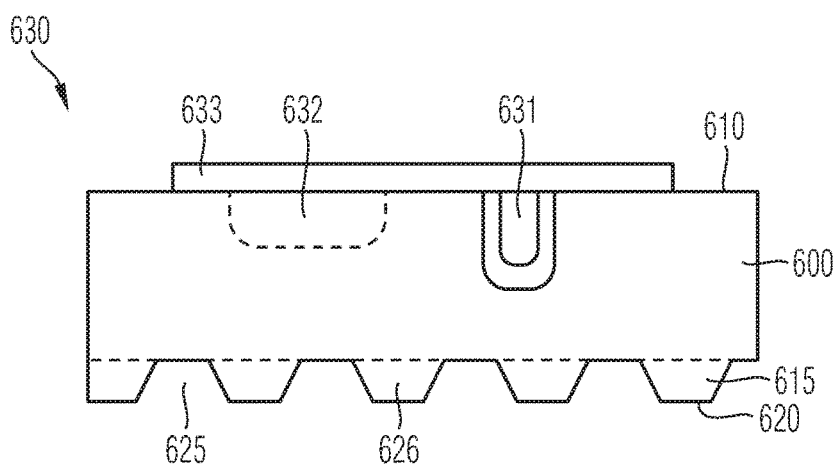
FIG. 7B shows a cross-sectional view of a semiconductor device according to one or more embodiments.

FIG. 7B shows a cross-sectional view of a semiconductor device according to one or more further embodiments. The semiconductor body 600 comprises a doped region 615 at the second main surface 620. The semiconductor body 600 and the doped region 615 may be of reverse conductivity types. For example, the doped region 615 may implement an emitter region of a power semiconductor device. Using the method which has been described above, the doped region 615 may be patterned so as to form a plurality of patterned emitter regions 626 which are separated from each other by recessed regions 625. Accordingly, using the method described, the backside emitter region 615 may be laterally patterned. As a result, an increased robustness with respect to short circuits may be achieved. According to further concepts, an improved softness during switching off may be achieved due to the locally enhanced backside emitter concept.

Figure 7C:
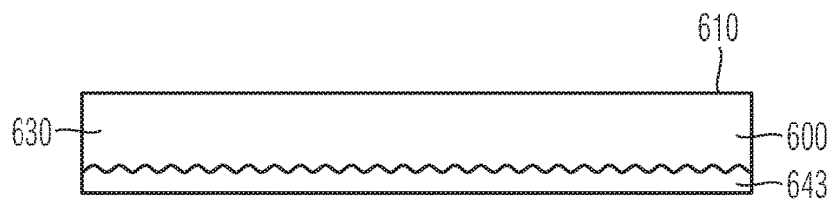
FIG. 7C shows a cross-sectional view of a semiconductor device according to one or more embodiments.

FIG. 7C shows a vertical cross-sectional view of semiconductor device 630, e.g. a power semiconductor device according to a further embodiment. The semiconductor device 630 comprises a semiconductor body 600 and a metallization layer 643. The metal of the metallization layer 643 may be selected from e.g. of the group of titanium (Ti), tungsten (W), nickel (Ni), and alloys thereof. Optionally, the metallization layer 643 may comprise several layers. For example, a silver (Ag) layer may be formed over a base layer that may be made of T1. The method described with reference to FIGS. 4A to 4D may have been performed to form the surface roughness at the rear surface 620 of the semiconductor body 600. Due to the surface roughness of the rear surface 620 of the semiconductor body, the adhesion of the metal layer 643 to the semiconductor body 600 may be improved. Moreover, according to embodiments, the grain orientation of the metallization layer which is deposited over the rear surface 620 of the semiconductor body may be set in accordance with process requirements. Components of power semiconductor devices may be formed in the first main surface 610 or in the rear surface 620 of the semiconductor body 600 in a similar manner as has been discussed with reference to FIGS. 7A and 7B.

Figure 8A:
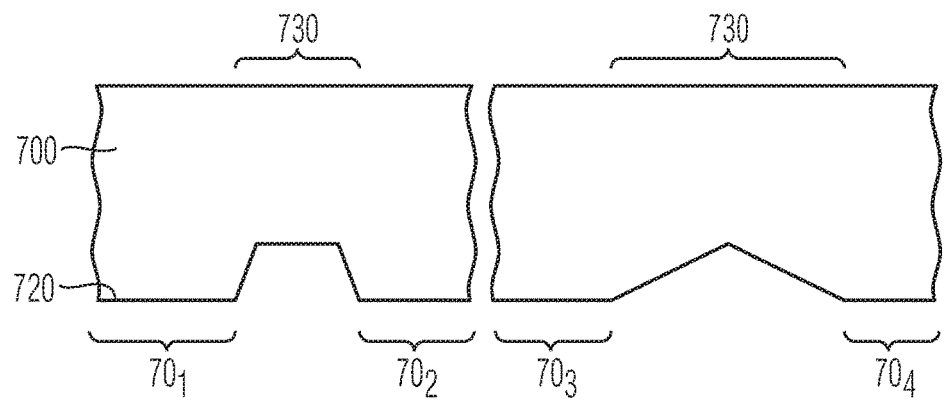
FIGS. 8A and 8B illustrate portions of a wafer that has been processed using the method according to embodiments.

According to further embodiments, the method may be used to thin a semiconductor wafer in a region in which the single chips are to be isolated. FIG. 8A shows an example of a cross-sectional view of a region of a semiconductor wafer. The semiconductor wafer 700 has been processed to define several chips 701 to 704. Separation regions 730 are disposed between the active regions of each of the single chips 701 to 704. According to embodiments, the etching process which has been explained above may be performed so as to thin the wafer in the separation regions 730. For example, as is illustrated in the left-hand portion of FIG. 8A, the wafer may be thinned so as to provide two different thicknesses of the wafer. According to further embodiments, a certain angle may be set by appropriately setting the etch rates. This is shown in the right-hand portion of FIG. 8A. Due to this processing, the single chips may be isolated e.g. using sawing or a laser treatment while generating a reduced amount of defects.

Figure 8B:
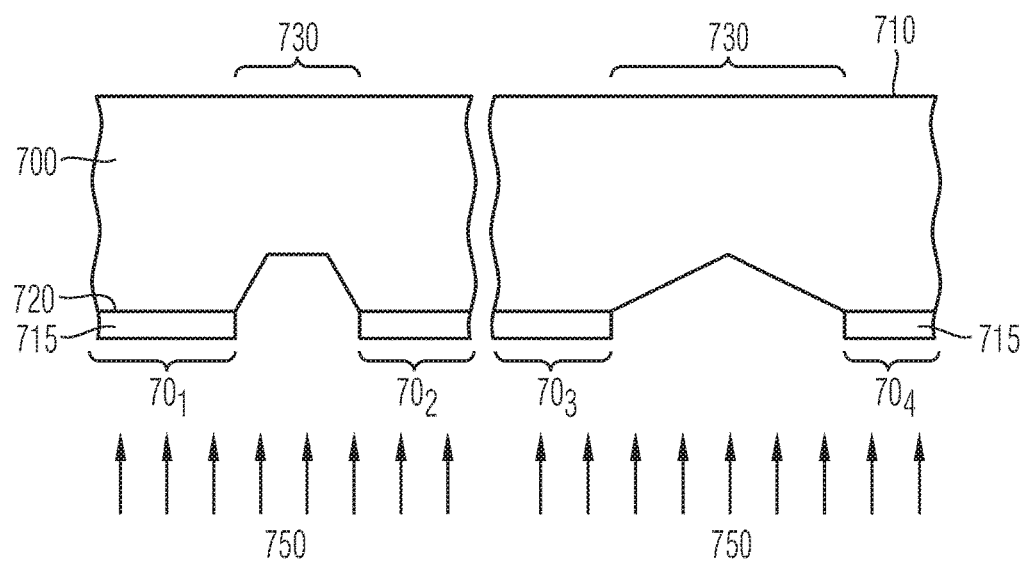
Figure 9A:
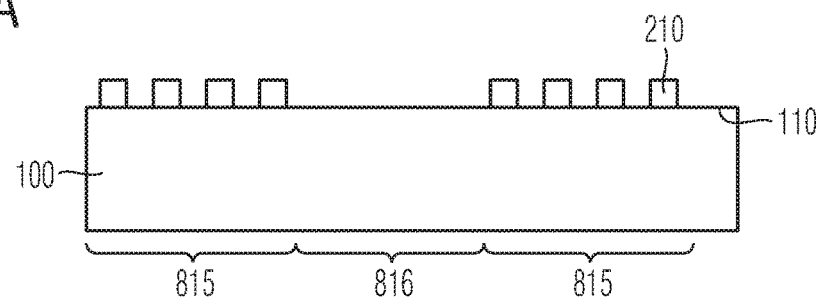
FIGS. 9A to 9D illustrate cross-sectional views of a workpiece when performing a method according to further embodiments.

According to further embodiments, an implantation with protons may be performed, from the rear surface 720 of the wafer e.g. using protons. For example, the protons may be implanted at an angle of 0° with respect to a normal to the rear surface 720. FIG. 8B schematically illustrates such an implantation process. Due to this implantation, which may be followed by an annealing step between 350° C. and 430° C., a lateral channel stopper may be generated. As a result, a depletion zone at the chip edge may be prevented from proceeding. A mask 715 may be arranged on the rear surface 720. As a result, the protons are implanted into the uncovered portion of the rear surface 720 of the semiconductor wafer. FIGS. 9A to 9D illustrate a workpiece when performing a method according to one or more further embodiments. In particular, FIGS. 9A to 9E illustrate a method of forming a pattern of n-doped regions and of p-doped regions at the second main surface of a workpiece. Inert structures 210 may be formed over a first main surface no of a semiconductor substrate 100 in region 815. The inert structures 210 are absent from region 816. As is clearly to be understood, instead of forming protruding portions, the inert structures 210 may be buried within the semiconductor substrate in the manner that has been explained above. In regions 815, a pattern of inert structures is formed which results in a reduced etch rate with respect to region 816. In particular, the pattern of inert structures 210 is formed in accordance with a topology of a semiconductor layer that is to be formed over the first main surface no. FIG. 9A shows an example of a resulting structure.

Figure 9B:
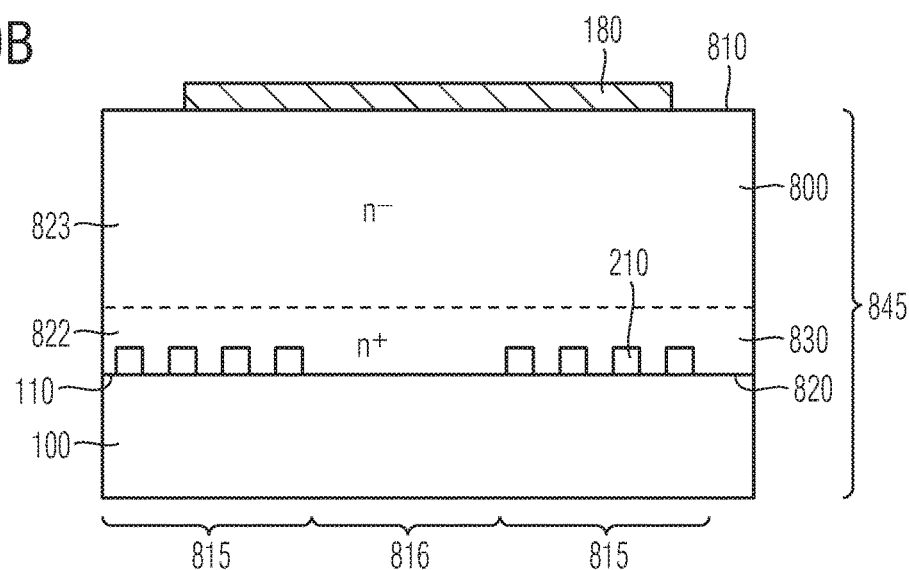

Thereafter, a layer of monocrystalline semiconductor material 800 is epitaxially formed over the first main surface no of the semiconductor substrate 100. For example, a doping concentration may be varied during epitaxial growth. As a result, a layer region 822 having an increased doping concentration is formed directly adjacent to the first main surface no of the semiconductor substrate 100, followed by a region 823 having a reduced doping concentration. In the example illustrated with reference to FIGS. 9A to 9D, the layer of monocrystalline semiconductor material 800 is doped with n-type dopants. The workpiece 845 comprising the semiconductor substrate 100 and the layer of monocrystalline semiconductor material 800 is mounted to a carrier 180. FIG. 9B shows an example of a resulting structure.

Figure 9C:
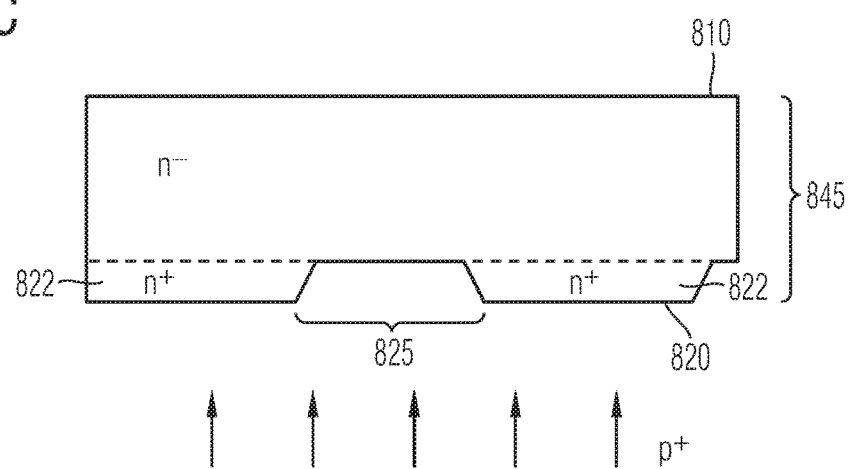

After thinning the workpiece 845 from the rear surface, an etching process in the manner as has been explained above is performed. As a result of the etching process, the layer region 822 is patterned by forming an opening 825 in the rear surface 820 of the semiconductor workpiece 845. Remaining portions of the layer region 822 are arranged on opposite sides of the opening 825. FIG. 9C shows an example of a resulting structure. It is to be noted that depending on the specific pattern of the inert structures 210, an inverse pattern of patterned layer region 822 shown in FIG. 9C may be generated.

Figure 9D:
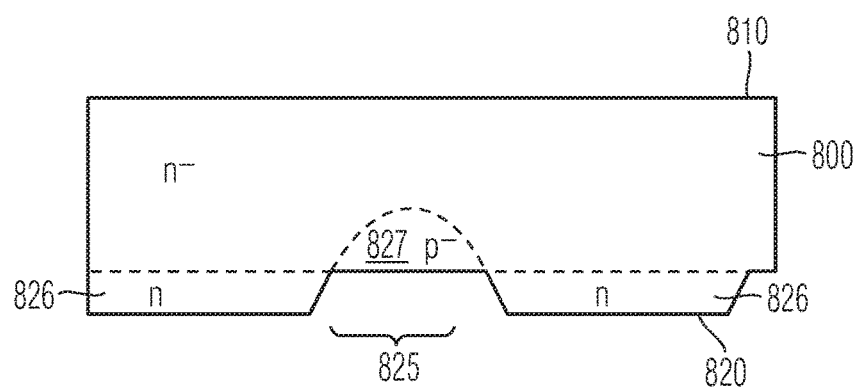

Then, an ion implantation with p-type dopants is performed. The implantation dose is set so that the n+-type regions 822 will remain n-type, whereas the n--doped region will be doped to p-. FIG. 9D shows an example of a resulting structure. As is shown, n and p-doped regions 826, 827 are arranged alternatingly adjacent to a second main surface 820 of the semiconductor body 800. Accordingly, a rear surface patterning of a doped layer may be performed in a simple manner. Accordingly, complicated lithographic processes for patterning the doping regions may be avoided. For example, such a patterned rear surface may be used in a power semiconductor device such as a reverse conducting IGBT.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments.

What is claimed is:

1. A method for manufacturing a semiconductor device comprising:
    forming a mask comprising a pattern of inert structures on a side of a first main surface of a semiconductor substrate,
    thereafter, forming a semiconductor layer over the first main surface,
    thinning the semiconductor substrate from a second main surface opposite to the first main surface; and
    thereafter, anisotropically etching a semiconductor region laterally adjoining the inert structures, wherein the semiconductor region comprises a first portion and a second portion, and wherein the pattern of inert structures in the first portion is different from the pattern of inert structures in the second portion or the inert structures are absent from the second portion.

2. The method according to claim 1, wherein an etch rate of the semiconductor region in the first portion is different from an etch rate in the second portion.

3. The method according to claim 2, wherein after anisotropically etching a difference between a thickness of the semiconductor region in the first portion and in the second portion is more than 100 nm.

4. The method according to claim 1, wherein anisotropically etching the semiconductor region laterally adjoining the inert structures defines a first etching process, the method further comprising a second etching process of etching the semiconductor layer after the semiconductor region laterally adjoining the inert structures has been etched, an etch rate of the second etching process being different from the etch rate of the first etching process.

5. The method according to claim 1, wherein etching is stopped as soon as the semiconductor region laterally adjoining the inert structures has been etched.

6. The method according to claim 1, wherein the inert structures have a width of 50 to 700 nm.

7. The method according to claim 1, wherein a distance between the inert structures is 200 to 700 nm.

8. The method according to claim 1, wherein forming the pattern of inert structures on a side of the first main surface of the semiconductor substrate comprises:
    forming and patterning a layer of an inert material on a first main surface of a semiconductor substrate.

9. The method according to claim 1, wherein forming the pattern of inert structures on a side of the first main surface of the semiconductor substrate comprises:
    forming trenches in the first main surface of the semiconductor substrate; and
    filling the trenches with an inert material.

10. The method according to claim 1, wherein forming the semiconductor layer comprises epitaxially growing the semiconductor layer.

11. The method according to claim 1, wherein the semiconductor layer has a thickness of less than 100 μm after anisotropically etching the semiconductor region.

12. A power semiconductor device formed in a semiconductor body, obtainable by performing the method according to claim 1.

13. A method for manufacturing a semiconductor device comprising:
  forming a mask in a semiconductor material, the mask comprising a first mask portion in a first portion of the semiconductor material and a second mask portion in a second portion of the semiconductor material, the first mask portion being configured to induce an etching at a first etch rate, the second mask portion being configured to induce an etching at a second etch rate, the first etch rate being different from the second etch rate; and
  anisotropically etching the semiconductor material.

14. The method according to claim 13, wherein the first mask portion induces an etching in a first crystal direction and the second mask portion induces an etching in a second crystal direction, the first crystal direction being different from the second crystal direction.

15. A power semiconductor device formed in a semiconductor body, obtainable by performing the method according to claim 13.

16. A method for manufacturing a semiconductor device comprising:
  forming a mask comprising a pattern of inert structures on a side of a first main surface of a semiconductor substrate,
  thereafter, forming a semiconductor layer over the first main surface,
  thinning the semiconductor substrate from a second main surface opposite to the first main surface; and
  thereafter, anisotropically etching a semiconductor region laterally adjoining the inert structures, wherein anisotropically etching the semiconductor region laterally adjoining the inert structures defines a first etching process, the method further comprising a second etching process of etching the semiconductor layer after the semiconductor region laterally adjoining the inert structures has been etched, an etch rate of the second etching process being different from the etch rate of the first etching process.

17. A method for manufacturing a semiconductor device comprising:
  forming a mask comprising a pattern of inert structures on a side of a first main surface of a semiconductor substrate,
  thereafter, forming a semiconductor layer over the first main surface,
  thinning the semiconductor substrate from a second main surface opposite to the first main surface; and
  thereafter, anisotropically etching a semiconductor region laterally adjoining the inert structures, wherein forming the pattern of inert structures on a side of the first main surface of the semiconductor substrate comprises:
  forming trenches in the first main surface of the semiconductor substrate; and
  filling the trenches with an inert material.

18. A method for manufacturing a semiconductor device comprising:
  forming a mask comprising a pattern of inert structures on a side of a first main surface of a semiconductor substrate,
  thereafter, forming a semiconductor layer over the first main surface,
  thinning the semiconductor substrate from a second main surface opposite to the first main surface; and
  thereafter, anisotropically etching a semiconductor region laterally adjoining the inert structures, wherein the semiconductor layer has a thickness of less than 100 µm after anisotropically etching the semiconductor region.

* * * * *